(12) United States Patent
Feng et al.

(10) Patent No.: US 10,490,557 B2
(45) Date of Patent: Nov. 26, 2019

(54) SEMICONDUCTOR STRUCTURE WITH CONTACT PLUG AND METHOD OF FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Li-Wei Feng, Kaohsiung (TW); Ying-Chiao Wang, Changhua County (TW); Chien-Ting Ho, Taichung (TW); Kai-Ping Chen, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/915,042

(22) Filed: Mar. 7, 2018

(65) Prior Publication Data
US 2018/0294269 A1  Oct. 11, 2018

(30) Foreign Application Priority Data
Apr. 7, 2017  (CN) .......................... 2017 1 0224689

(51) Int. Cl.
*H01L 27/108*  (2006.01)
*H01L 21/768*  (2006.01)
*H01L 23/532*  (2006.01)
*H01L 23/535*  (2006.01)

(52) U.S. Cl.
CPC .. *H01L 27/10897* (2013.01); *H01L 21/76805* (2013.01); *H01L 21/76816* (2013.01); *H01L 21/76819* (2013.01); *H01L 21/76829* (2013.01); *H01L 21/76895* (2013.01); *H01L 23/535* (2013.01); *H01L 23/53295* (2013.01); *H01L 27/1085* (2013.01); *H01L 27/10894* (2013.01); *H01L 27/10814* (2013.01); *H01L 27/10823* (2013.01)

(58) Field of Classification Search
CPC ................... H01L 27/10814; H01L 27/10805
See application file for complete search history.

(56) References Cited

U.S. PATENT DOCUMENTS

| 6,017,614 A | 1/2000 | Tsai |
| 6,074,908 A * | 6/2000 | Huang .............. H01L 27/10814 257/E21.656 |
| 6,350,642 B1 | 2/2002 | Lee |
| 7,482,257 B2 | 1/2009 | Yu |

(Continued)

*Primary Examiner* — Grant S Withers
(74) *Attorney, Agent, or Firm* — Winston Hsu

(57) ABSTRACT

A semiconductor structure having a contact plug includes a substrate. A memory cell region and a peripheral circuit region are defined on the substrate. At least one memory cell is disposed on the substrate within the memory cell region. The memory cell includes a transistor and a capacitor structure. A first planar stacked dielectric layer covers the peripheral circuit region. The first planar stacked dielectric layer includes two first dielectric layers and a second dielectric layer. The first dielectric layer at the bottom of the first planar stacked dielectric layer extends to the memory cell region and covers the capacitor structure. A contact plug is disposed at the peripheral circuit region and penetrates the first planar stacked dielectric layer.

17 Claims, 10 Drawing Sheets

(56) References Cited

U.S. PATENT DOCUMENTS

| | | | | |
|---|---|---|---|---|
| 2001/0022369 A1* | 9/2001 | Fukuda | ............ | H01L 27/10894 |
| | | | | 257/207 |
| 2002/0003305 A1* | 1/2002 | Umakoshi | ......... | H01L 21/76802 |
| | | | | 257/760 |
| 2003/0052350 A1* | 3/2003 | Ohno | ................ | H01L 27/10817 |
| | | | | 257/296 |
| 2004/0120179 A1* | 6/2004 | Ishigaki | ................ | G11C 11/412 |
| | | | | 365/149 |

* cited by examiner

SEMICONDUCTOR STRUCTURE WITH CONTACT PLUG AND METHOD OF FABRICATING THE SAME

BACKGROUND OF THE INVENTION

1. Field of the Invention

The present invention relates to a method of fabricating a semiconductor structure with a contact plug, and more particularly, to a method of fabricating a semiconductor structure with a contact plug by using a stacked dielectric layer.

2. Description of the Prior Art

A dynamic random access memory (DRAM) comprises a MOS transistor, a capacitor. The MOS transistor is used for transferring electric charge, the capacitor is used for storing the charge to memorize information, and the capacitor electrically connects to the MOS transistor.

A substrate is usually divided into a memory cell region and a peripheral circuit region. The capacitor is within the memory cell region. Transistors and contact elements are disposed in the peripheral circuit region. The capacitor usually has a great height in order to gain more capacitance. The height of the capacitor leads to a large thickness of a dielectric layer covering the peripheral circuit region. When forming a contact plug in the dielectric layer, a contact hole is formed by etching through the dielectric layer with large thickness. This large thickness reduces the accuracy of an etching process, however, which causes an over etching problem. The end result is that the elements in the peripheral circuit region are damaged.

SUMMARY OF THE INVENTION

In view of the above, it would be an advantage in the art to provide a method of fabricating a semiconductor structure with a contact plug which is not subject to the over etching problem.

According to a first preferred embodiment of the present invention, a semiconductor structure with a contact plug includes a substrate comprising a memory cell region and a peripheral circuit region, wherein a memory cell is disposed within the memory cell region and comprises a transistor and a capacitor structure. A first planar stacked dielectric layer covers the peripheral circuit region. The first planar stacked dielectric layer comprises two first dielectric layers and a second dielectric layer being arranged in a sequence of the first dielectric layer, the second dielectric layer and the first dielectric layer stacked from bottom to top of the first planar stacked dielectric layer. The first dielectric layer at the bottom of the first planar stacked dielectric layer extends to the memory cell region and covers the capacitor structure. A contact plug is disposed within the peripheral circuit region and penetrates the first planar stacked dielectric layer.

According to a second preferred embodiment of the present invention, a semiconductor structure with a contact plug includes the steps of providing a substrate, the substrate comprising a memory cell region and a peripheral circuit region, wherein a memory cell is disposed within the memory cell region and comprises a transistor and a capacitor structure. Later, a first stacked dielectric layer is formed to cover the memory cell region and the peripheral circuit region, wherein the first stacked dielectric layer comprises two first dielectric layers and a second dielectric layer being arranged in a sequence of the first dielectric layer, the second dielectric layer and the first dielectric layer stacked from bottom to top of the first stacked dielectric layer. Next, a planarization process is performed to remove the first dielectric layer on top of the second dielectric layer and expose the second dielectric layer to form a first planar stacked dielectric layer. Finally, after the planarization process, a contact plug is formed within the peripheral circuit region and penetrates the first planar stacked dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 depict a fabricating method of a semiconductor structure with a contact plug according to a first preferred embodiment of the present invention, wherein:

FIG. 1 shows a substrate with a capacitor structure;
FIG. 2 is a fabricating stage following FIG. 1;
FIG. 3 is a fabricating stage following FIG. 2;
FIG. 4 is a fabricating stage following FIG. 3;
and
FIG. 5 is a fabricating stage following FIG. 4.
FIG. 7 to FIG. 9 depict a fabricating method of a semiconductor structure with a contact plug according to a second preferred embodiment of the present invention, wherein:

FIG. 7 shows a substrate with a capacitor structure;
FIG. 8 is a fabricating stage following FIG. 7;
and
FIG. 9 is a fabricating stage following FIG. 8.

DETAILED DESCRIPTION

Figure 1:
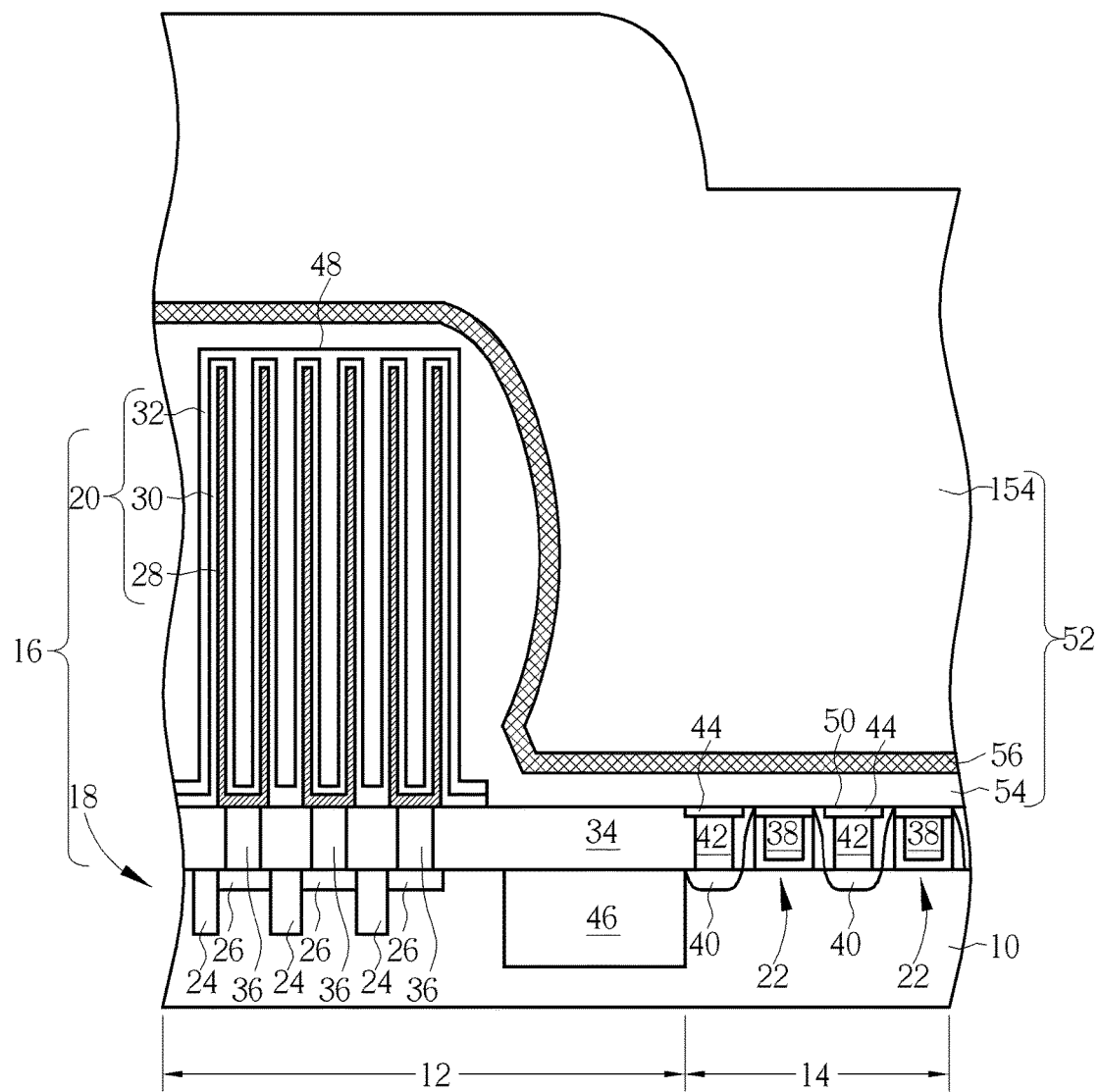

FIG. 1 to FIG. 5 depict a fabricating method of a semiconductor structure with a contact plug according to a first preferred embodiment of the present invention. As shown in FIG. 1, a substrate 10 is provided. The substrate 10 is divided into at least one memory cell region 12 and at least one peripheral circuit region 14. A memory cell 16 such as a dynamic random access memory, (DRAM) cell is disposed within the memory cell region 12. Numerous memory cells 16 are shown in FIG. 1 as an example. Each of the memory cells 16 includes a first transistor 18 and a capacitor structure 20. At least one second transistor 20 is disposed within the peripheral circuit region 14 on the substrate 10. In this embodiment, each of the first transistors 18 includes a buried gate 24 and source/drain doping regions 26. The buried gate 24 is embedded in the substrate 10. The source/drain doping regions 26 are disposed in the substrate 10 at two sides of the buried gate 24. The capacitor structure 20 includes a bottom electrode 28, an insulating layer 30 and a top electrode 32. Furthermore, a mask structure (not shown) may be optionally disposed on the top electrode 32. Generally, the mask structure only covers the top and the sidewall of the capacitor structure 20, and does not cover the peripheral circuit region 14. A dielectric layer 34 and contact plugs 36 can be disposed between the capacitor structure 20 and the first transistors 18. The dielectric layer 34 may be single-layered or multiple-layered. Each of the contact plugs 36 electrically connects to one of the source/drain doping regions 26 of each of the first transistors 18 and the capacitor structure 20.

The second transistor 22 is disposed in the dielectric layer 34. The second transistor 22 includes a gate 38. Source/drain doping regions 40 are disposed at two sides of the gate 38. A contact plug 42 is embedded in the dielectric layer 34 and electrically connects to the source/drain doping regions 40. A conductive pad 44 is disposed above the contact plug 42 and electrically connects to the contact plug 42. Furthermore, an insulating layer 46 such as a shallow trench isolation (STI) or a field oxide (FOX) is used to isolate the memory cell region 12 from the peripheral circuit region 14. The top surface 48 of the capacitor 20 and the top surface 50 of the conductive pad 44 form a step profile.

Next, a first stacked dielectric layer 52 is formed to conformally cover the peripheral circuit region 14 and the memory cell region 12. The first stacked dielectric layer 52 includes two first dielectric layers 54/154, and a second dielectric layer 56. In detail, the steps of forming the first stacked dielectric layer 52 include forming one of the first dielectric layer 54 followed by forming the second dielectric layer 56. Finally, the other first dielectric layer 154 is formed on the second dielectric layer 56. The first dielectric layer 54, the second dielectric layer 56 and the first dielectric layer 154 are arranged in sequence from bottom to top of the first stacked dielectric layer 52. The first dielectric layer 54 and the first dielectric layer 154 are of the same material. The thickness of the first dielectric layer 54 and the thickness of the first dielectric layer 154 may be the same or different. The second dielectric layer 56 is sandwiched between the first dielectric layer and the first dielectric layer 154. Therefore, the second dielectric layer 56 contacts the first dielectric layer 54 and the first dielectric layer 154. The material of the first dielectric layers 54/154 is different from the material of the second dielectric layer 56. Therefore, the first dielectric layers 54/154 have a different etching rate from that of the second dielectric layer 56. In one embodiment, the etching selectivity ratio of the first dielectric layers 54 to the second dielectric layer 56 and the etching selectivity ratio of the first dielectric layers 154 to the second dielectric layer 56 are both greater than 5, and preferably greater than 7. The first dielectric layers 54/154 are preferably silicon oxide. The second dielectric layer 56 is preferably silicon nitride, silicon oxynitride, silicon carbide nitride or metal oxide. The first dielectric layers 54/154 and the second dielectric layer 56 may be formed by a chemical vapor deposition, a physical vapor deposition, a plasma enhanced chemical vapor deposition, a spinning coating process or an atomic layer deposition. The second dielectric layer 56 in the first stacked dielectric layer 52 is thinner than the first dielectric layer 54 and the first dielectric layer 154 in the first stacked dielectric layer 52. Preferably, the first dielectric layer 154 at the top of the first stacked dielectric layer 52 is thicker than the first dielectric layer 54 at the bottom of the first stacked dielectric layer 52. Furthermore, because there is a step profile between the top surface 48 of the capacitor structure 20 and the top surface 50 of the conductive pad 44, the first stacked dielectric layer 54 forms another step profile between the memory cell region 12 and the peripheral circuit region 14.

Figure 2:
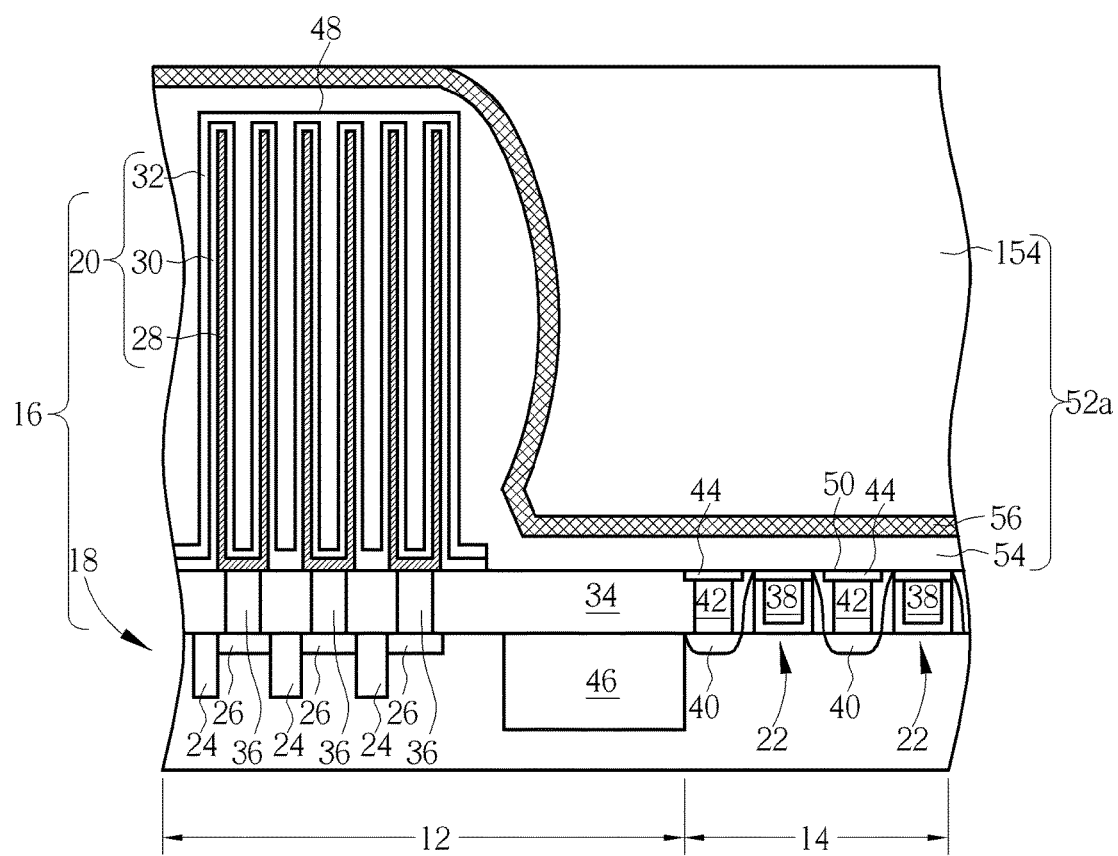
Figure 3:
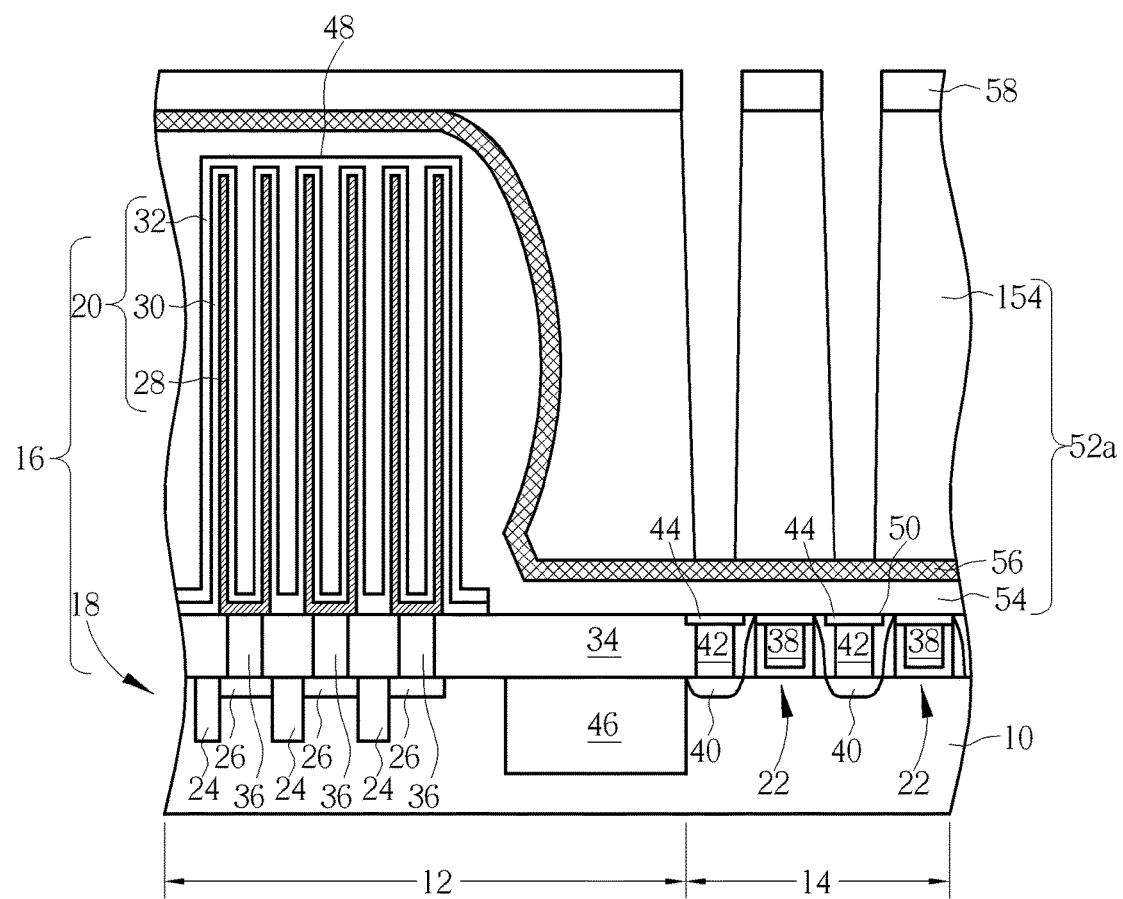
Figure 4:
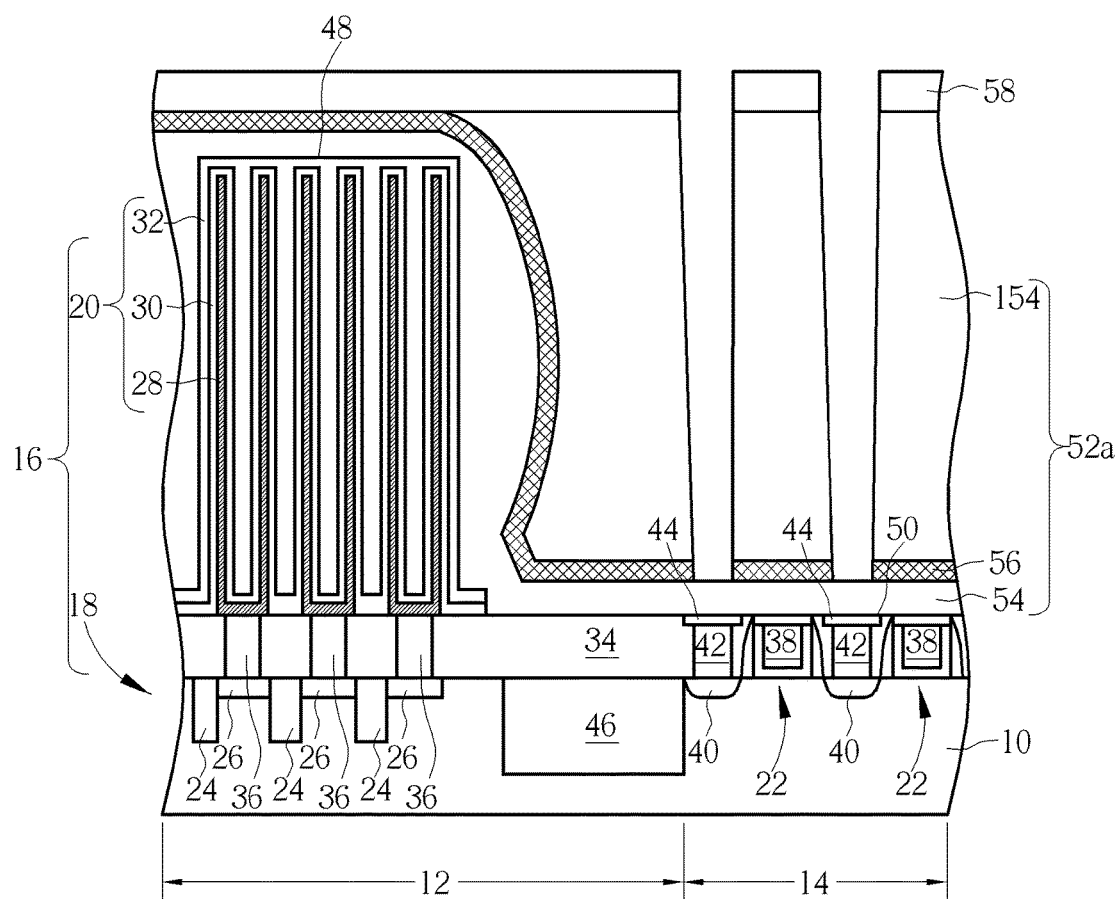
Figure 5:
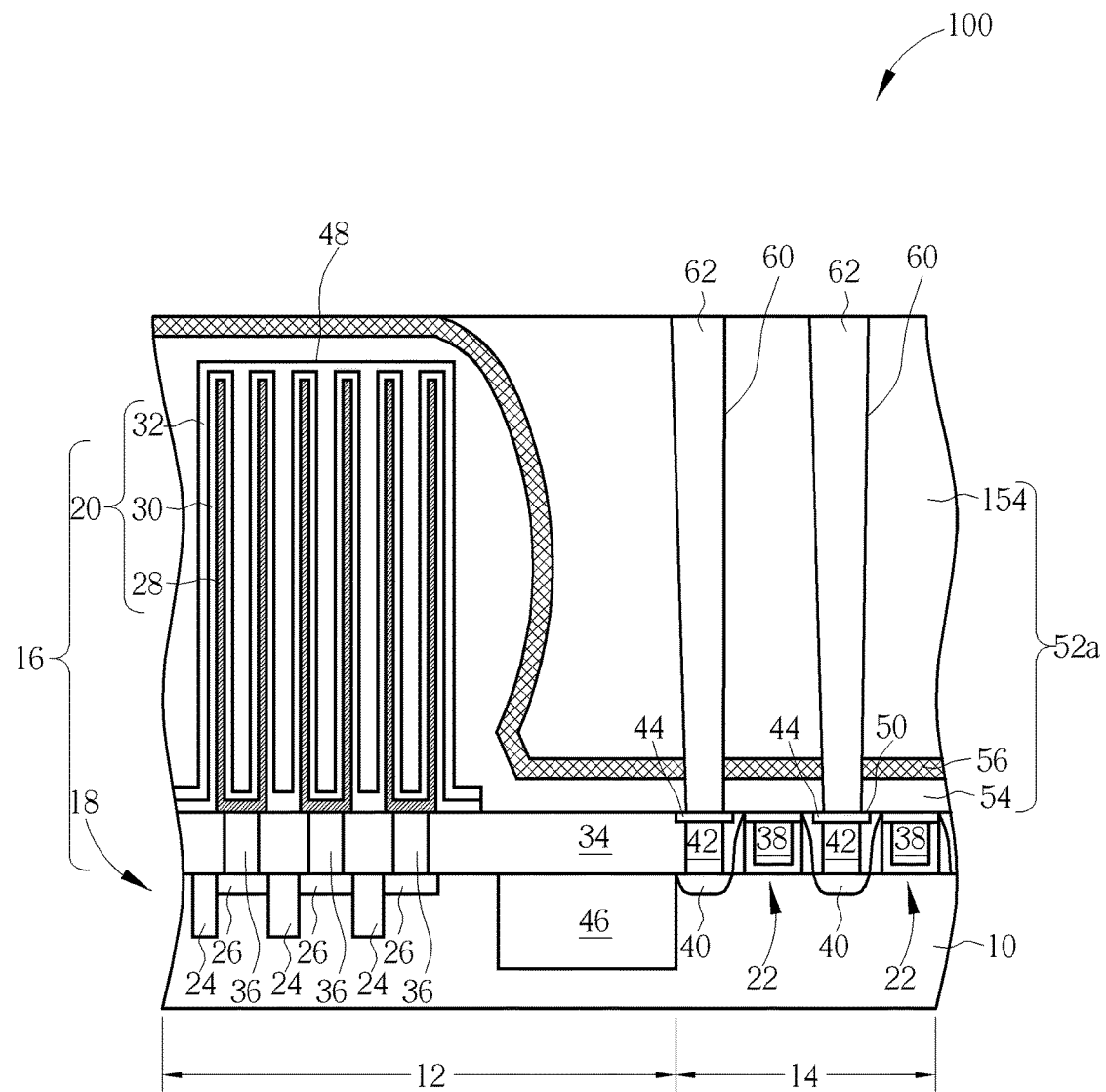

As shown in FIG. 2, the first dielectric layer 154 is planarized by taking the second dielectric layer 56 as an etching stop layer. In detail, the first dielectric layer 154 is removed and planarized to expose the second dielectric layer 56 within the memory cell region 12. The top surface of the exposed second dielectric layer 56 is aligned with the top surface of the remaining first dielectric layer 154. At this point, the first stacked dielectric layer 52 is transformed into a first planar stacked dielectric layer 52a. As shown in FIG. 3, a patterned mask 58 is formed to cover the first dielectric layer 154, the second dielectric layer 56 and a first dielectric layer 54. The patterned mask 58 defines at least one position of a contact hole within the peripheral circuit region 14. Later, the first dielectric layer 154 is etched to expose the second dielectric layer 56 by taking the patterned mask 58 as an etching mask. As shown in FIG. 4, the second dielectric layer 56 is etched continuously by taking the patterned mask 58 as an etching mask until the first dielectric layer 54 is exposed. As shown in FIG. 5, the first dielectric layer 54 is etched, and the first dielectric layer 54 stops being etched at the point when the conductive pad 44 is exposed. At this point, the contact hole 60 is completed. Later, the patterned mask 58 is removed. Next, a contact plug 62 is formed in the contact hole. The contact plug 62 may be metal materials such as titanium, tungsten or titanium nitride. The contact plug 62 is disposed within the peripheral circuit region 14 and penetrates the first planar stacked dielectric layer 52a. At this point, the semiconductor structure with a contact plug 100 of the present invention is completed. One end of the contact plug 62 is at the first dielectric layer 54 at the bottom of the first planar stacked dielectric layer 52a. The contact hole 60 in the present invention is usually formed by a dry etching process. During the formation of the contact hole 60, the first dielectric layer 154, the second dielectric layer 56 and the first dielectric layer 54 are etched in sequence. Because the material of the first dielectric layers 54/154 is different from the material of the second dielectric layer 56, when the first dielectric layer 154 is etched through and the second dielectric layer 56 is exposed, the etchant should be changed. For example, when the first dielectric layer 154 is etched, the etchant is for etching silicon oxide. When the second dielectric layer 56 is exposed and starts to be etched, the etchant is changed to another etchant for etching silicon nitride. Similarly, after the second dielectric layer 56 is etched through and the first dielectric layer 54 is exposed, the etchant should be changed again. For example, when the second dielectric layer 56 is etched through and the first dielectric layer 54 starts to be etched, the etchant is changed from an etchant for etching silicon nitride to an etchant for etching silicon oxide.

In the conventional method of fabricating a contact hole, the first stacked dielectric layer 52 is replaced by a single-layered dielectric layer such as a single-layered silicon nitride. Under this circumstance, the single-layered dielectric layer is very thick. Therefore, during the formation of the contact hole, the single-layered dielectric layer is etched through to form the contact hole and expose the contact pad 44 in a single etching step. Over etching always happens when etching the single-layered dielectric layer, however. This over etching damages the conductive pad 44 or even deteriorates the device under the conductive pad 44. The present invention uses a multiple-layered dielectric layer instead of a single-layered dielectric layer. The multiple-layered dielectric layer such as the first planar stacked dielectric layer 52a is etched to form a contact hole 60. The first planar stacked dielectric layer 52a is etched in a sequence of the first dielectric layer 154, the second dielectric layer 56 and the first dielectric layer 54. At the step of etching the first dielectric layer 54 to expose the conductive pad 44, the thickness of the first dielectric layer 54 is much smaller than the single-layered dielectric layer in the conventional method. The smaller thickness can prevent the over etching problem.

Furthermore, in the conventional method, the single-layered dielectric layer has a step profile between the memory cell region 12 and the peripheral circuit region 14.

The single-layered dielectric layer is thicker in the peripheral circuit region 14 than in the memory cell region 12. Because of the step profile, the planarization is hard to stop at an appropriate point, and the single-layered dielectric layer that should remain on the capacitor structure is removed. Even the top electrode of the capacitor structure will be damaged. In the present invention, during the planarization process, because of different etching selectivity ratios between the first dielectric layer 154 and the second dielectric layer 56, the second dielectric layer 56 can serve as a stop layer. In this way, after the planarization process, the second dielectric layer 56 can remain on the capacitor structure 20. The first dielectric layer 54 still covers the memory cell region 12 and the peripheral circuit region 14.

Furthermore, an interface between the insulating layer 30 and the dielectric layer 34 in the peripheral circuit region 14 and an interface between the top electrode 32 and the dielectric layer 34 in the peripheral circuit region 14 have interface stresses. In the conventional method, a single-layered dielectric layer has a stress in only one direction. This stress make the interface stresses easily spread in the single-layered dielectric layer and cause cracking. In the present invention, the first dielectric layers 54/154 have a different stress direction from that of the second dielectric layer 56. The interface stresses therefore cannot spread easily in the first dielectric layers 54/154 and the second dielectric layer 56.

Figure 6:
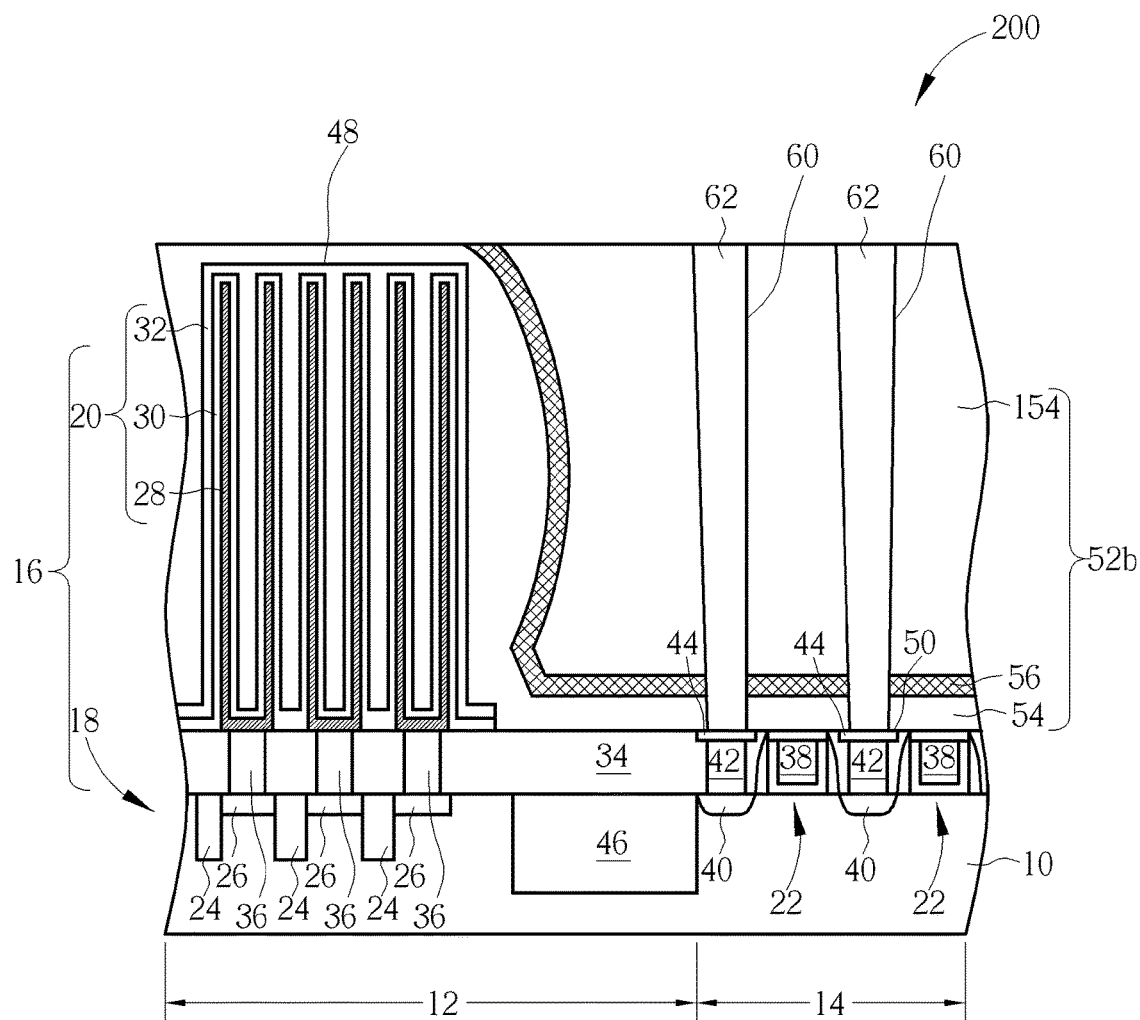
FIG. 6 depicts a modification of a fabricating method of the first preferred embodiment.

According to another preferred embodiment of the present invention, as shown in FIG. 2, after the first dielectric layer 154 is planarized to expose the second dielectric layer 56, the planarization process can continue to remove the second dielectric layer 56 entirely to expose the first dielectric layer 54. At this point, the first stacked dielectric layer 52 is transformed into a first planar stacked dielectric layer 52b. Later, the contact hole 60 and the contact plug 62 can be formed by using the steps shown in FIG. 2 to FIG. 5 to form a semiconductor structure with a contact plug 200 as shown in FIG. 6.

Figure 7:
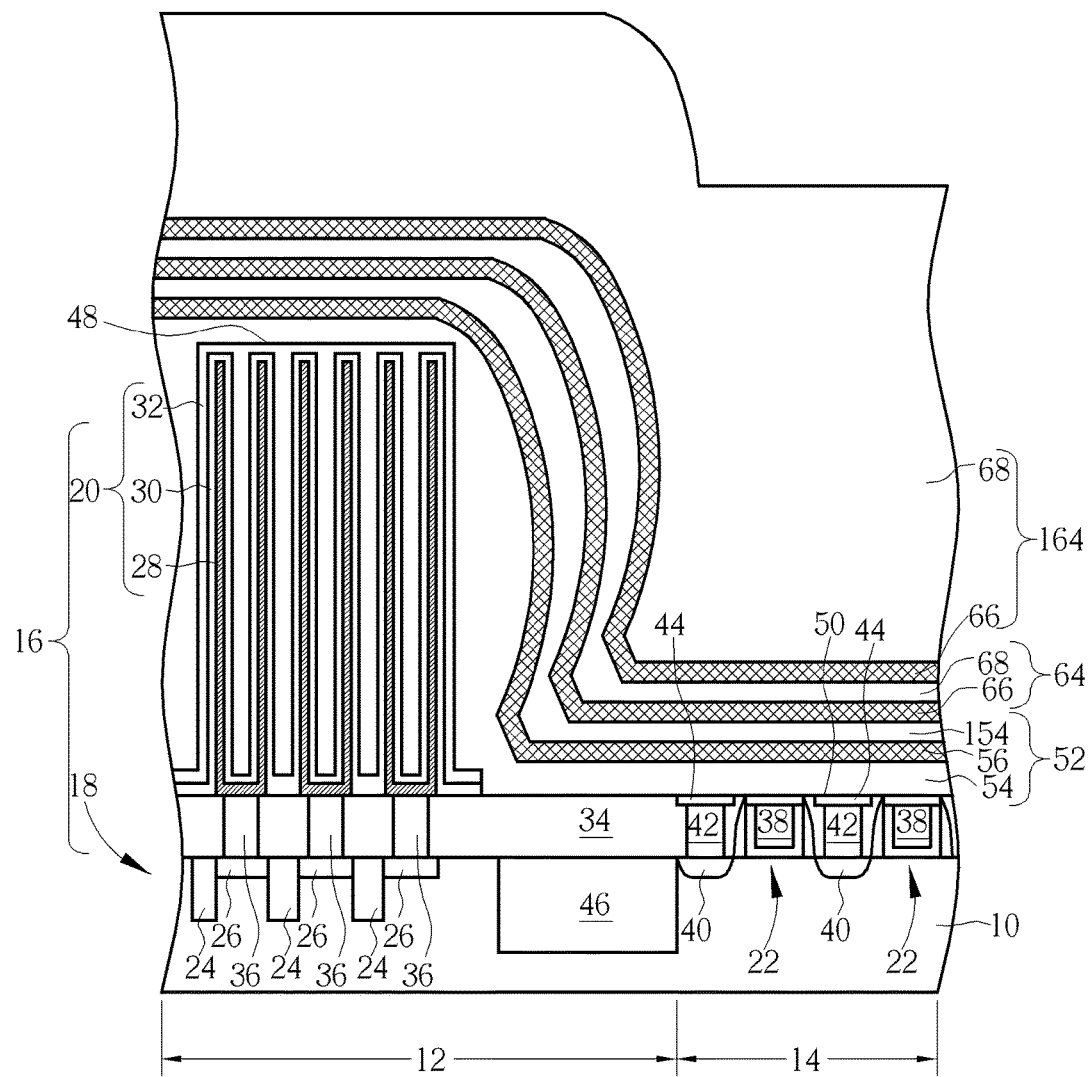
Figure 8:
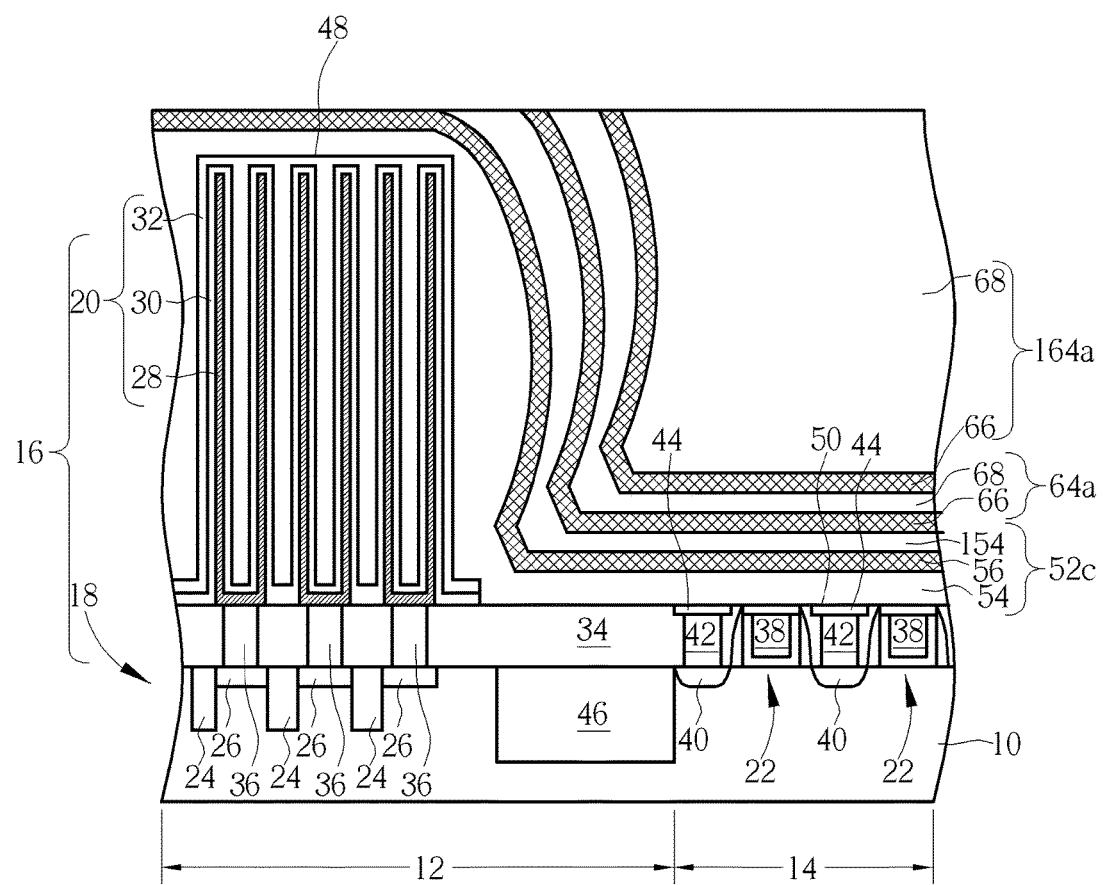
Figure 9:
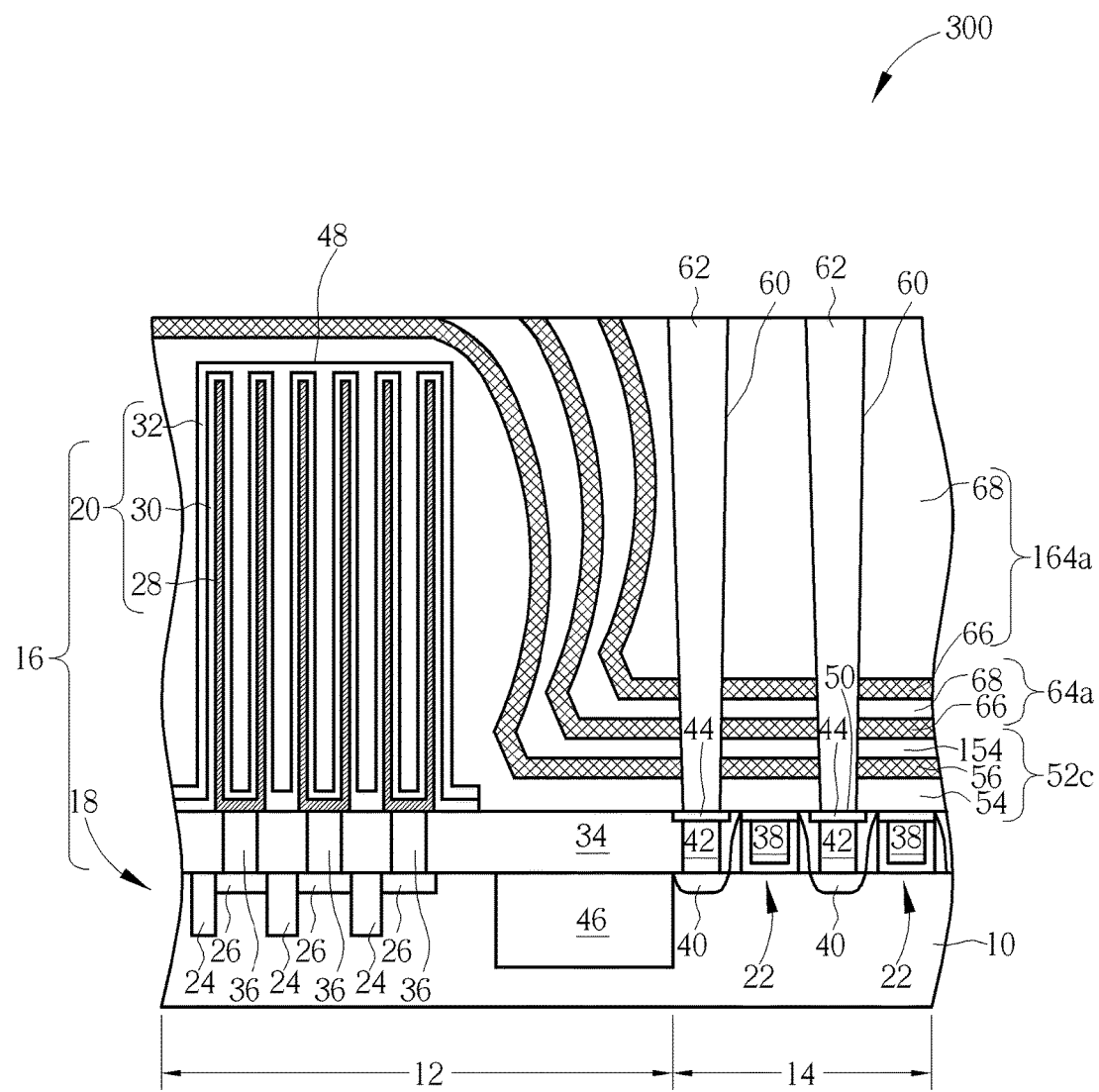

FIG. 7 to FIG. 9 depict a fabricating method of a semiconductor structure with a contact plug according to a second preferred embodiment of the present invention, wherein elements which are substantially the same as those in the first preferred embodiment are denoted by the same reference numerals; an accompanying explanation is therefore omitted. The difference between the second preferred embodiment and the first preferred embodiment is that there is at least one second stacked dielectric layer in the second preferred embodiment. The rest elements in the memory cell region and the peripheral circuit region are the same as in the first preferred embodiment.

As shown in FIG. 7, a substrate 10 is provided. The substrate 10 is divided into at least one memory cell region 12 and at least one peripheral circuit region 14. The memory cell 16, the capacitor structure 20, the second transistor 22, the contact plug 62, the conductive pad 44 and other elements are disposed at the same position as in the first preferred embodiment.

Next, a first stacked dielectric layer 52 is formed to conformally cover the peripheral circuit region 14 and the memory cell region 12. The first stacked dielectric layer 52 includes two first dielectric layers 54/154, and a second dielectric layer 56. The first dielectric layer 54, the second dielectric layer 56 and the first dielectric layer 154 are arranged in sequence from bottom to top of the first stacked dielectric layer 52. Later, at least one second stacked dielectric layer 64 is formed to cover the first stacked dielectric layer 52. In the second preferred embodiment, two second stacked dielectric layers such as a second stacked dielectric layer 64 and a second stacked dielectric layer 164 are shown as an example. The second stacked dielectric layer 64 and the second stacked dielectric layer 164 are made of the same material. Both the second stacked dielectric layer 64 and the second stacked dielectric layer 164 consist of one second dielectric layer 66 and one first dielectric layer 68 arranged from bottom to top. The numeral of second stacked dielectric layer 64 and the second stacked dielectric layer 164 is only for distinguishing the position of the second stacked dielectric layer 64 and the second stacked dielectric layer 164. Based on different requirements, there can be numerous second stacked dielectric layers 64/164 formed on the first stacked dielectric layer 52. The material of the first dielectric layer 68 is the same as that of the first dielectric layer 54/154. The material of the second dielectric layer 66 is the same as that of the second dielectric layer 56. All the materials of the first dielectric layers in the present invention are the same. Different numerals for each of the first dielectric layers are only for distinguishing the position of the first dielectric layers. All the materials of the second dielectric layers in the present invention are the same. Different numerals for each of the second dielectric layers are only for distinguishing the position of the second dielectric layers. At this point, the first dielectric layers 54/68/154 and the second dielectric layers 64/164 are arranged alternately. The first dielectric layers 54/68/154 respectively contact a top and a bottom of each of the second dielectric layers 56/66. The number of the second stacked dielectric layer 64 can be altered. Furthermore, the first dielectric layer 68 which is at the topmost layer among the first dielectric layers 54/68/154 and the second dielectric layers 56/66 has the greatest thickness compared to the first dielectric layers 54/154 and the second dielectric layers 56/66. The second dielectric layer 66 is preferably silicon nitride, silicon oxynitride, silicon carbide nitride or metal oxide. In other cases, the second dielectric layer 66 can be a different material from that of the second dielectric layer 56 as long as the second dielectric layers 56/66 have enough etching selectivity ratio with respect to the first dielectric layers 54/154. For example, the second dielectric layer 66 can be metal oxide. The second dielectric layer 56 can be silicon nitride.

As shown in FIG. 8, the second stacked dielectric layer 64, the second stacked dielectric layer 164 and the first stacked dielectric layer 52 are planarized by taking the second dielectric layer 56 in the first stacked dielectric layer 52 as a stop layer. In other words, the planarization process stops when the second dielectric layer 56 is exposed. At this point, the second stacked dielectric layer 164 is transformed into a second planar stacked dielectric layer 164a. The second stacked dielectric layer 64 is transformed into a second planar stacked dielectric layer 64a. The first stacked dielectric layer 52 is transformed into a first planar stacked dielectric layer 52c. The top surface of the second dielectric layer 56 within the memory cell region 12 is aligned with the top surface of the first dielectric layer 68 in the second planar stacked dielectric layer 164a within the peripheral circuit region 14. As shown in FIG. 9, a contact hole is formed in the first planar stacked dielectric layer 52c, the second planar stacked dielectric layer 64a, and the second planar stacked dielectric layer 164a. The method of forming the contact hole may include etching the second planar stacked dielectric layer 164a, the second planar stacked dielectric layer 64a and the first planar stacked dielectric layer 52c. Finally, a contact plug 62 is formed in the contact hole 60. At this point, a semiconductor structure with a contact plug 300 of the present invention is completed. The contact plug 62 is within the peripheral circuit region 14 and penetrates the second planar stacked dielectric layer 164a, the second planar stacked dielectric layer 64a and the first planar stacked dielectric layer 52c.

Figure 10:
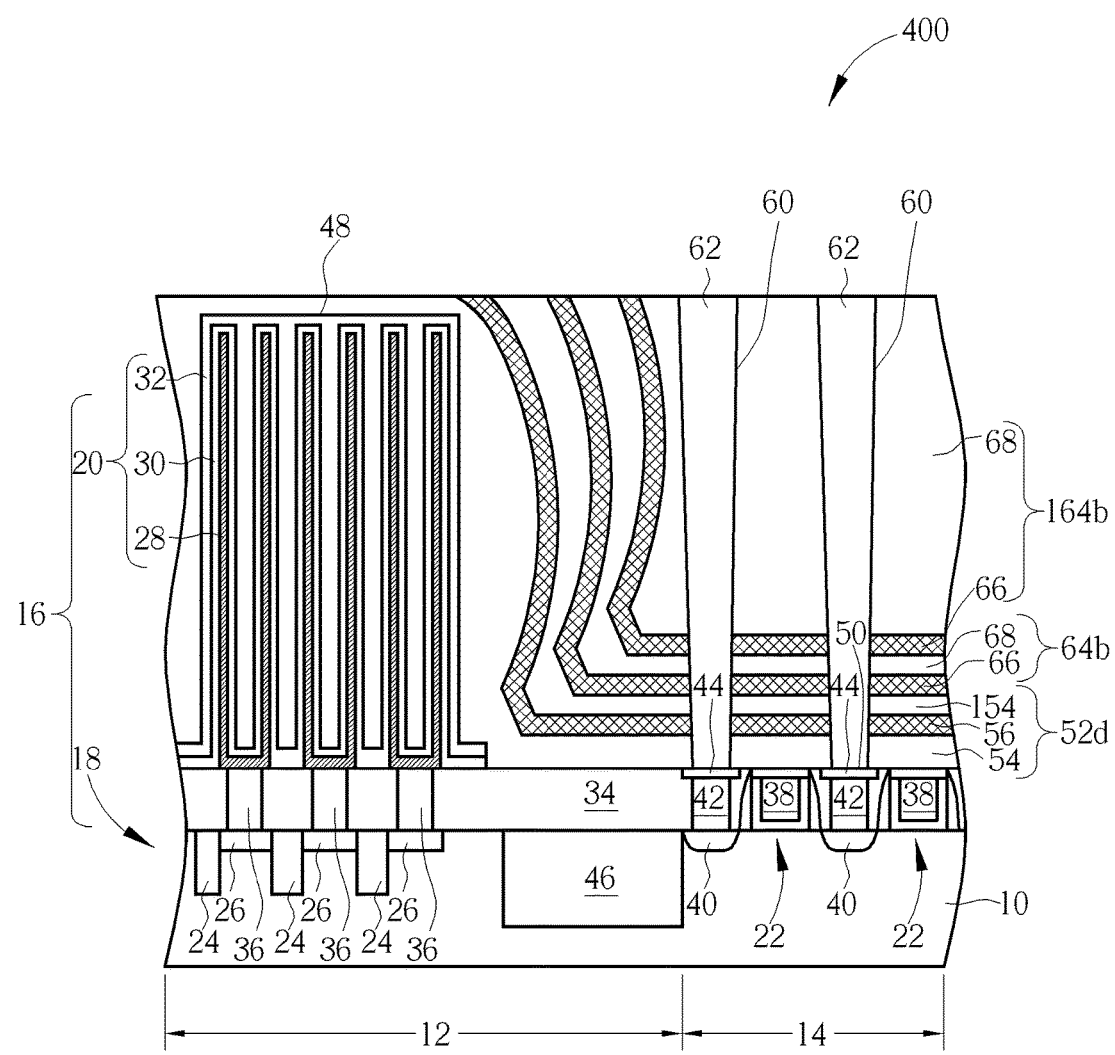
FIG. 10 depicts a modification of a fabricating method of the second preferred embodiment.

According to another preferred embodiment of the present invention, after forming the first planar stacked dielectric layer 52c, the planarization process can continue to remove the second dielectric layer 56 entirely to expose the first dielectric layer 54. At this point, the second planar stacked dielectric layers 64a/164a in the peripheral circuit region 14 are respectively transformed into a second planar stacked dielectric layer 64b and a second planar stacked dielectric layer 164b. The first planar stacked dielectric layer 52c is transformed into a first planar stacked dielectric layer 52d. Later, the contact hole 60 and the contact plug 62 can be formed by using the steps shown in FIG. 7 to FIG. 9 to form a semiconductor structure with a contact plug 400 as shown in FIG. 10.

As shown in FIG. 5, a semiconductor structure with a contact plug 100 includes a substrate 10. The substrate 10 is divided into at least one memory cell region 12 and at least one peripheral circuit region 14. A memory cell 16 such as a DRAM cell is disposed within the memory cell region 12. Each of the memory cells 16 includes a first transistor 18 and a capacitor structure 20. At least one second transistor 20 is disposed within the peripheral circuit region 14 on the substrate 10. A first planar stacked dielectric layer 52a covers the peripheral circuit region 14. The first planar stacked dielectric layer 52a includes two first dielectric layers 54/154 and a second dielectric layer 56. The first dielectric layers 54/154 and the second dielectric layer 56 are arranged in a sequence of the first dielectric layer 54, the second dielectric layer 56 and the first dielectric layer 154 stacked from bottom to top of the first planar stacked dielectric layer 52a. The first dielectric layer 54 at the bottom of the first planar stacked dielectric layer 52a extends to the memory cell region 12 and covers the capacitor structure 20. A contact plug 62 is disposed within the peripheral circuit region 14 and penetrates the first planar stacked dielectric layer 52a. One end of the contact plug 62 is disposed in the first dielectric layer 54 below the second dielectric layer 56. A material of the first dielectric layers 54/154 is different from a material of the second dielectric layer 56. A material of the first dielectric layer 54 is the same as a material of the first dielectric layer 154. The material of the first dielectric layers 54/154 is preferably silicon oxide. The material of the second dielectric layer 56 is preferably silicon nitride or metal oxide. A thickness of the second dielectric layer 56 is between one tenth and one eighth of a thickness of the first planar stacked dielectric layer 52a.

According to another preferred embodiment of the present invention, a semiconductor structure with a contact plug 200 is provided in FIG. 6. The difference between the semiconductor structure with a contact plug 200 and the semiconductor structure with a contact plug 100 is that the second dielectric layer 56 of the semiconductor structure with a contact plug 200 does not extend to the capacitor structure 20. The remaining elements in FIG. 6 are the same as in FIG. 5; an accompanying explanation is therefore omitted.

At least one second planar stacked dielectric layer can be disposed on the semiconductor structure with a contact plug. For example, a semiconductor structure with a contact plug 300 shown in FIG. 9 has two second planar stacked dielectric layers 64a/164a disposed on the first planar stacked dielectric layer 52c. The number of the second planar stacked dielectric layers 64a/164a can be changed based on different requirements. Both the second stacked dielectric layer 64 and the second stacked dielectric layer 164 consist of one second dielectric layer 66 and one first dielectric layer 68 arranged from bottom to top. The first planar stacked dielectric layer 52c includes two first dielectric layers 54/154, and a second dielectric layer 56. The first dielectric layer 54, the second dielectric layer 56 and the first dielectric layer 154 are arranged in sequence from bottom to top of the first planar stacked dielectric layer 52c. The second dielectric layer 56 and the first dielectric layer 54 below the first dielectric layer 154 extend to the memory cell region 12 and cover the capacitor structure 20. The materials of the first dielectric layers 54/68/154 are the same. Different numerals for each of the first dielectric layers are only for distinguishing the position of the first dielectric layers. The materials of the second dielectric layers 56/66/154 are the same. Different numerals for each of the second dielectric layers are only for distinguishing the position of the second dielectric layers. The contact plug 62 is disposed in the peripheral circuit region 14 and penetrates the second planar stacked dielectric layer 164a, the second planar stacked dielectric layer 64a and first planar stacked dielectric layer 52c. A thickness of the second dielectric layer 66 is between one tenth and one eighth of the summed thickness of the first planar stacked dielectric layer 52c, the second planar stacked dielectric layer 164a and the second planar stacked dielectric layer 64a.

According to another preferred embodiment of the present invention, a semiconductor structure with a contact plug 400 is provided in FIG. 10. The difference between the semiconductor structure with a contact plug 300 and the semiconductor structure with a contact plug 400 is that, in the semiconductor structure with a contact plug 400, only the first dielectric layer 54 in the first planar stacked dielectric layer 52d remains in the memory cell region 12, and the second dielectric layer 56 does not cover the capacitor structure 20. In other words, the second dielectric layer 56 in the first planar stacked dielectric layer 52d does not cover the capacitor structure 20. The second dielectric layer 56 in the first planar stacked dielectric layer 52c covers the capacitor structure 20. The rest of elements in FIG. 10 are the same as in FIG. 9; an accompanying explanation is therefore omitted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure with a contact plug, comprising:
   a substrate comprising a memory cell region and a peripheral circuit region, wherein a memory cell is disposed within the memory cell region and the memory cell comprises a transistor and a capacitor structure;
   a first planar stacked dielectric layer covering the peripheral circuit region, wherein the first planar stacked dielectric layer comprises a first dielectric layer, a second dielectric layer and a third dielectric layer which are arranged in a sequence of the first dielectric layer, the second dielectric layer and the third dielectric layer stacked from bottom to top of the first planar stacked dielectric layer, the first dielectric layer and the third dielectric layer are made of the same type of material, the first dielectric layer is a single layer, and the first dielectric layer extends to the memory cell region and covers the capacitor structure from above, and wherein a bottommost surface of the first planar stacked dielectric layer in the peripheral circuit region is aligned with a bottommost surface of the capacitor structure, and a topmost surface of the first planar stacked dielectric layer in the peripheral circuit region is higher than a topmost surface of the capacitor structure; and a contact plug disposed within the peripheral circuit region and penetrating the first planar stacked dielectric layer, wherein the bottommost surface of the first planar stacked dielectric layer in the peripheral circuit region is aligned with one end of the contact plug.

2. The semiconductor structure with a contact plug of claim 1, wherein the second dielectric layer extends to the memory cell region and covers the capacitor structure.

3. The semiconductor structure with a contact plug of claim 1, wherein a thickness of the second dielectric layer is between one tenth and one eighth of a thickness of the first planar stacked dielectric layer.

4. The semiconductor structure with a contact plug of claim 1, wherein at least one gate is disposed within the peripheral circuit region, and the contact plug electrically connects to the gate.

5. The semiconductor structure with a contact plug of claim 1, wherein a material of the first dielectric layer is different from a material of the second dielectric layer.

6. The semiconductor structure with a contact plug of claim 1, further comprising a second planar stacked dielectric layer disposed within the peripheral circuit region and covering the first planar stacked dielectric layer, wherein the second planar stacked dielectric layer comprises a fourth dielectric layer and a fifth dielectric layer disposed from bottom to top of the second planar stacked dielectric layer, wherein the fourth dielectric layer and the second dielectric layer are made of the same type of material, and the fifth dielectric layer and the first dielectric layer are made of the same type of material.

7. The semiconductor structure with a contact plug of claim 6, wherein the contact plug penetrates the second planar stacked dielectric layer.

8. The semiconductor structure with a contact plug of claim 1, wherein the second dielectric layer does not cover the topmost surface of the capacitor structure entirely.

9. The semiconductor structure with a contact plug of claim 1, wherein the second dielectric layer comprises silicon nitride, silicon oxynitride, silicon carbide nitride or metal oxide.

10. A fabricating method of a semiconductor structure with a contact plug, comprising:
providing a substrate, the substrate comprising a memory cell region and a peripheral circuit region, wherein a memory cell is disposed within the memory cell region and the memory cell comprises a transistor and a capacitor structure;
forming a first stacked dielectric layer covering the memory cell region and the peripheral circuit region, wherein the first stacked dielectric layer comprises a first dielectric layer, a second dielectric layer and a third dielectric layer which are arranged in a sequence of the first dielectric layer, the second dielectric layer and the third dielectric layer stacked from bottom to top of the first stacked dielectric layer, the first dielectric layer extends to the memory cell region and covers the capacitor structure from above, the first dielectric layer and the third dielectric layer are made of the same type of material, and the first dielectric layer is a single layer;
performing a planarization process to remove the third dielectric layer and expose the second dielectric layer to form a first planar stacked dielectric layer; and
after the planarization process, forming a contact plug within the peripheral circuit region and penetrating the first planar stacked dielectric layer, wherein after the planarization process, a bottommost surface of the first planar stacked dielectric layer in the peripheral circuit region is aligned with a bottommost surface of the capacitor structure, a topmost surface of the first planar stacked dielectric layer in the peripheral circuit region is higher than a topmost surface of the capacitor structure and the bottommost surface of the first planar stacked dielectric layer in the peripheral circuit region is align with one end of the contact plug.

11. The fabricating method of a semiconductor structure with a contact plug of claim 10, wherein after removing the third dielectric layer, the second dielectric layer is removed to expose the first dielectric layer.

12. The fabricating method of a semiconductor structure with a contact plug of claim 10, further comprising:
before the planarization process, forming at least one second planar stacked dielectric layer in the peripheral circuit region and the memory cell region, and covering the first stacked dielectric layer, wherein the second stacked dielectric layer comprises a fourth-dielectric layer and a fifth dielectric layer below the fourth dielectric layer, wherein the fourth dielectric layer and the second dielectric layer are made of the same type of material, and the fifth dielectric layer and the first dielectric layer are made of the same type of material.

13. The fabricating method of a semiconductor structure with a contact plug of claim 12, further comprising:
during the planarization process, removing the second stacked dielectric layer within the memory cell region to form a second planar stacked dielectric layer; and
after forming the second planar stacked dielectric layer, removing part of the first stacked dielectric layer to expose the second dielectric layer within the first stacked dielectric layer.

14. The fabricating method of a semiconductor structure with a contact plug of claim 12, further comprising:
during the planarization process, removing the second stacked dielectric layer within the memory cell region entirely to form a second planar stacked dielectric layer; and
after forming the second planar stacked dielectric layer, removing part of the first stacked dielectric layer to expose the first dielectric layer at the bottom of the first stacked dielectric layer.

15. The fabricating method of a semiconductor structure with a contact plug of claim 13, wherein the contact plug is disposed in the peripheral circuit region and penetrates the first planar stacked dielectric layer and the second planar stacked dielectric layer.

16. The fabricating method of a semiconductor structure with a contact plug of claim 10, wherein a material of the first dielectric layer is different from a material of the second dielectric layer.

17. The fabricating method of a semiconductor structure with a contact plug of claim 10, wherein the second dielectric layer comprises silicon nitride, silicon oxynitride, silicon carbide nitride or metal oxide.

* * * * *